United States Patent [19]

Kumagai

[11] Patent Number: 5,439,547
[45] Date of Patent: Aug. 8, 1995

[54] SEMICONDUCTOR MANUFACTURING APPARATUS WITH A SPARE VACUUM CHAMBER

[75] Inventor: Hiromi Kumagai, Tokyo, Japan

[73] Assignee: Tokyo Electron Kabushiki Kaisha, Japan

[21] Appl. No.: 140,887

[22] Filed: Oct. 25, 1993

Related U.S. Application Data

[63] Continuation of Ser. No. 889,409, May 28, 1992, abandoned.

[30] Foreign Application Priority Data

May 29, 1991 [JP] Japan ................. 3-124261

[51] Int. Cl.⁶ ............................................. C23F 1/02
[52] U.S. Cl. .................................. 156/345; 118/715; 118/719; 204/298.15; 204/298.25; 204/298.26
[58] Field of Search .................... 156/345, 643, 639; 118/715, 719, 723; 204/298.01, 298.02, 298.15, 298.25, 298.26

[56] References Cited

U.S. PATENT DOCUMENTS

| | | | |
|---|---|---|---|
| 4,584,045 | 4/1986 | Richards | 156/345 |
| 4,674,621 | 6/1987 | Takahashi | 204/298.25 |
| 4,785,962 | 11/1988 | Toshima | 204/298.25 |
| 4,816,638 | 3/1989 | Ukai et al. | 219/121.43 |
| 4,891,087 | 1/1990 | Davis et al. | 156/345 |
| 5,019,233 | 5/1991 | Blake | 204/298.25 |
| 5,110,394 | 5/1992 | Ogawa | 156/345 |
| 5,186,594 | 2/1993 | Toshima et al. | 204/298.25 |
| 5,246,528 | 9/1993 | Hasegawa et al. | 156/639 |

FOREIGN PATENT DOCUMENTS 0152555 8/1985 European Pat. Off. .

Primary Examiner—Olik Chaudhuri
Assistant Examiner—Long Pham
Attorney, Agent, or Firm—Beveridge, DeGrandi, Weilacher & Young

[57] ABSTRACT

In a semiconductor manufacturing apparatus, provided are a vacuum processing chamber which implements a required processing to an object of processing under an atmosphere of reduced pressure, a single spare vacuum processing chamber provided to one side and adjacent to the vacuum processing chamber and provided with a support mechanism to support the object of processing and a conveyor arm to convey the object of processing internally. Thus the object of processing is conveyed to the vacuum processing chamber and conveyed from the vacuum processing chamber via the spare vacuum processing chamber.

11 Claims, 5 Drawing Sheets

FIG. I

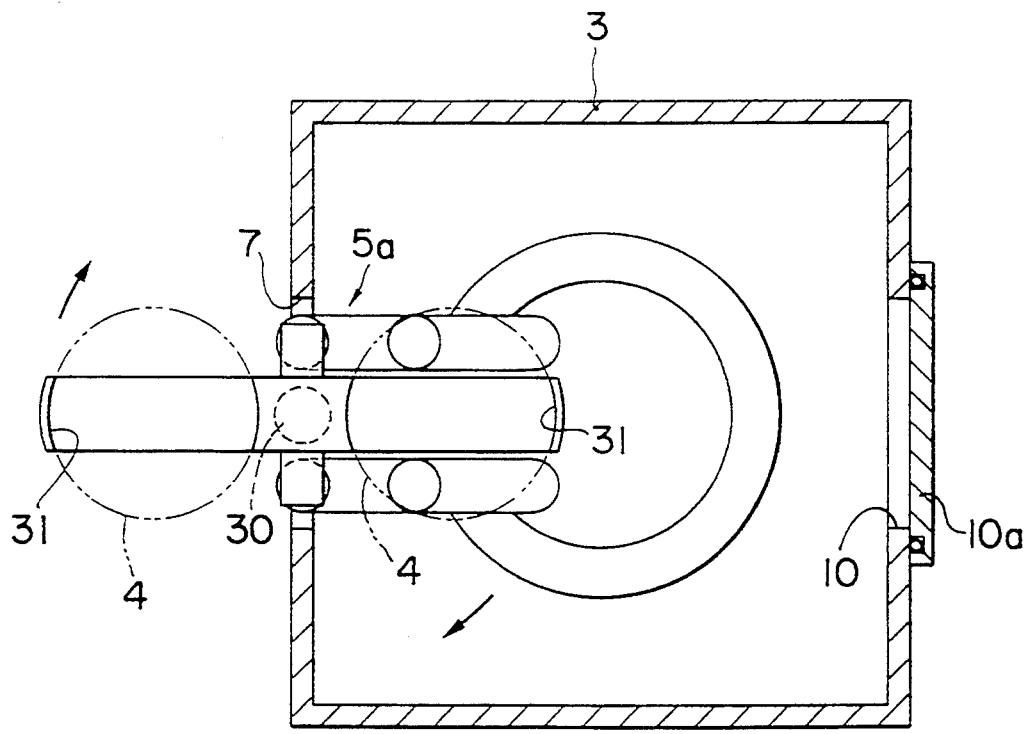
F I G. 4
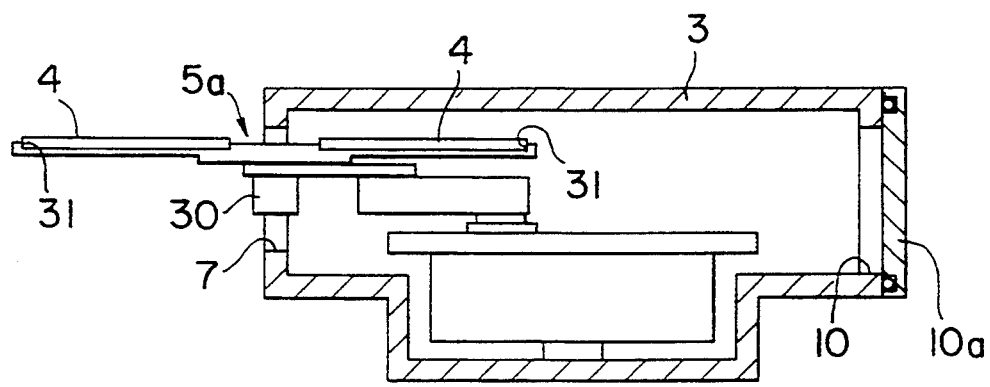
F I G. 5

SEMICONDUCTOR MANUFACTURING APPARATUS WITH A SPARE VACUUM CHAMBER

This application is a continuation of application Ser. No. 07/889,409, filed May 28, 1992, now abandoned, which application is entirely incorporated herein by reference.

BACKGROUND OF THE INVENTION

The present invention relates to semiconductor manufacturing apparatus such as etching apparatus.

In general, in semiconductor device manufacturing processes, an object such as a semiconductor wafer or the like to be processed is carried into a vacuum processing chamber of a semiconductor manufacturing apparatus and many processes are performed under an atmosphere of reduced pressure.

Semiconductor manufacturing apparatus which implement processes to an object to be processed under conditions of reduced pressure return the pressure inside the vacuum processing chamber to atmospheric pressure and again reduce the pressure each time the semiconductor wafer or the object of processing is carried into and out of the vacuum processing chamber, and this causes a reduction of the throughput (the amount of work performed in a unit time). Because of this, there are many cases where there is a spare vacuum chamber termed a load lock chamber, the internal volume of which is less than that of the vacuum processing chamber.

More specifically, as shown in FIG. 6, in a conventional semiconductor manufacturing apparatus (such as an etching apparatus or the like) where processing to an object to be processed is performed under an atmosphere of reduced pressure, there are provided two load lock chambers 3a, 3b adjacent to a vacuum processing chamber 2 and semiconductor wafers or some other object of processing 4 are carried into the vacuum processing chamber 2 by a conveyor arm 5a, and after processing, the semiconductor wafers or some other objects of processing 4 are carried out via the other load lock chamber 3b by the conveyor arm 5b. Doing this improves the throughput of the entire semiconductor manufacturing apparatus since the semiconductor wafers or some other objects of processing 4 can be carried into and out of the vacuum processing chamber 2 without the inside of the vacuum processing chamber 2 having to be returned to normal pressure.

Moreover, in the process for the manufacturing of semiconductor devices, dust generated in the processes causes an adverse influence to the formation of fine patterns and the like and because of this, the manufacturing apparatus is installed in a clean room which always has a downflow of cleaned air flowing from the ceiling to the floor.

However, in recent years, there has been a rapid tendency for semiconductor devices to require higher degrees of integration and fineness, and because of this, there has been an increase in the number of semiconductor manufacturing apparatus required since there is a larger number of processes. Moreover, the area of the clean room in which these semiconductor manufacturing apparatus must be installed increases, the facility cost increases and there is the problem of a rise in the manufacturing cost.

SUMMARY OF THE INVENTION

In the light of the problems associated with conventional semiconductor manufacturing apparatus, the present invention has as an object the provision of a semiconductor manufacturing apparatus which can solve these problems, which can reduce the apparatus cost when compared to conventional apparatus, require a lesser amount of installation space, and as a result promote a reduced product cost.

More specifically, the semiconductor manufacturing apparatus according to a first embodiment of the present invention is configured with a vacuum processing chamber for the implementation of a required processing to an object of processing under an atmosphere of reduced pressure, and a spare vacuum chamber provided adjacent to the vacuum processing chamber and provided with a conveyor arm for conveying objects of processing therein, a support mechanism for supporting the objects of processing, for carrying them into and from the vacuum processing chamber.

In addition, the semiconductor manufacturing apparatus according to a first embodiment of the present invention is configured with a vacuum processing chamber for the implementation of a required processing to an object of processing under an atmosphere of reduced pressure, and a spare vacuum chamber provided adjacent to the vacuum processing chamber and provided with a conveyor arm configured so as to be conveyable, and for supporting at least two objects of processing inside and carrying them into and from the vacuum processing chamber.

With the semiconductor manufacturing apparatus of the present invention, the provision of one spare vacuum chamber with a support mechanism for the objects of processing enables the realization of a reduction in the installation space and a reduction in the manufacturing cost. In addition, the conveyor arms which are configured so as to support either one or two objects of processing and which are provided so as to be conveyable inside the spare vacuum chamber enable one or two objects of processing to be handled so that it is possible to have the efficient carrying in and out of the objects of processing. Because of this, it is possible to have only the one spare vacuum chamber and to ensure substantially the same throughput as a conventional semiconductor manufacturing apparatus provided with two spare vacuum chambers, a spare vacuum chamber for carrying in and a spare vacuum chamber for carrying out.

Accordingly, it is possible to reduce the apparatus cost when compared to a conventional apparatus, to reduce the installation space, and to achieve a reduction in the manufacturing cost due to the reduction in the installation cost.

BRIEF DESCRIPTION OF THE DRAWINGS

FIG. 4 is a plan view of a conveyor arm of a semiconductor manufacturing apparatus according to a third embodiment of the present invention;

FIG. 5 is a side elevational view of the conveyor arm shown in FIG. 4; and

DETAILED DESCRIPTION OF THE PREFERRED EMBODIMENT

The following is a detailed description of an embodiment of the present invention applied to an etching apparatus for the implementation of etching processing to a semiconductor wafer, with reference to the appended drawings.

Figure 1:
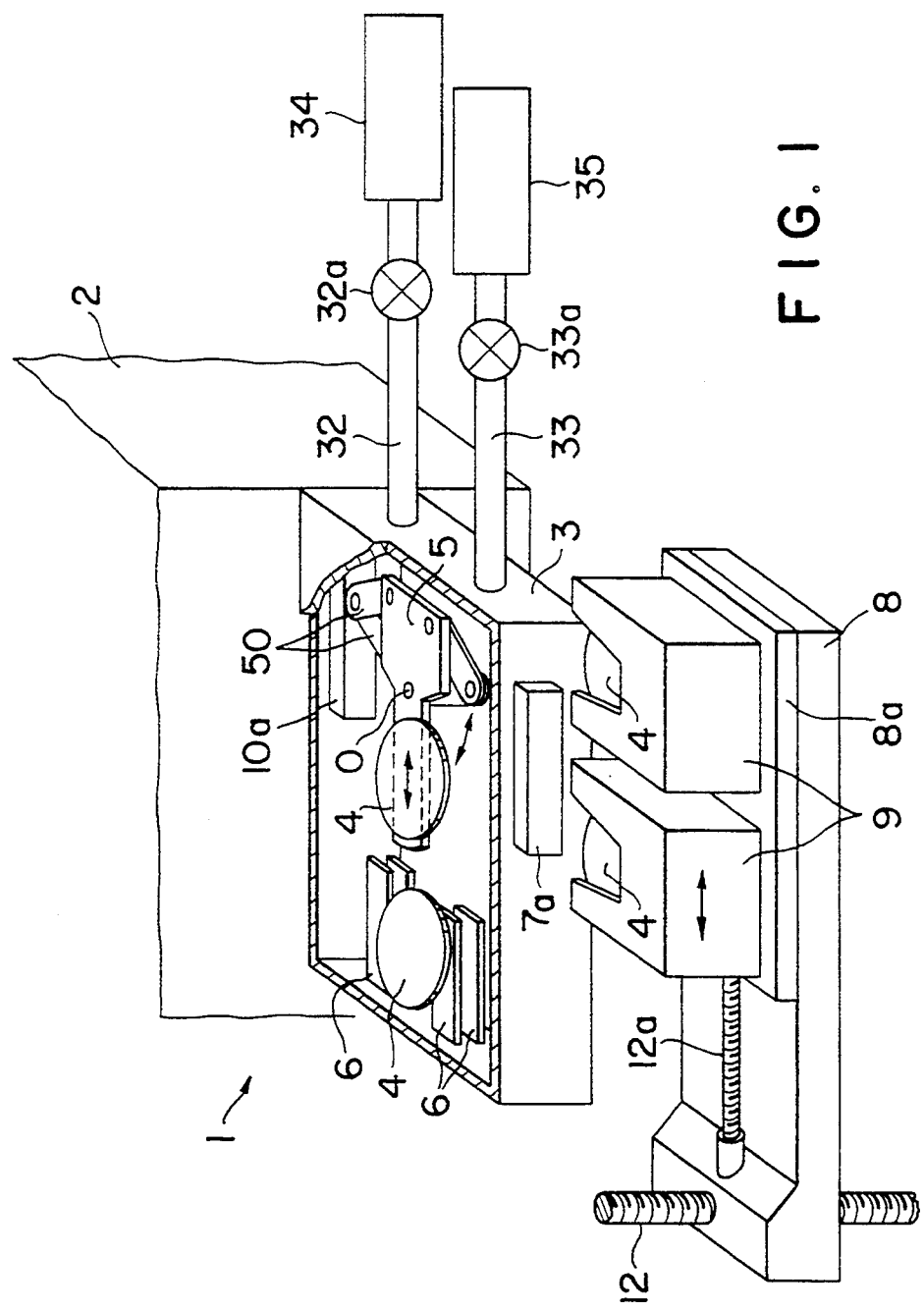
FIG. 1 is a partial cutaway view showing the overall configuration of a semiconductor manufacturing apparatus according to a first embodiment of the present invention.

As shown in FIG. 1, an etching apparatus 1 is provided with a vacuum processing chamber (processing chamber) 2 which implements etching processing to semiconductor wafers 4 under an atmosphere of reduced pressure. Adjacent to this vacuum processing chamber 2 to one side is provided a single spare vacuum processing chamber (load lock chamber) 3. Inside this load lock chamber 3 is provided a wafer support mechanism 6 configured so as support two semiconductor wafers 4 on upper and lower shelves thereof. This wafer support mechanism 6 is configured so as to be movable up and down by a drive mechanism (not shown). A conveyor arm 5 is also provided in the spare vacuum processing chamber 3 to convey the object of processing therein.

In addition, the load lock chamber 3 is provided with a carrying-in and carrying-out opening 7 which is provided with a gate valve (See FIG. 2), and to the outer side of this carrying-in and carrying-out opening 7 is provided with a cassette loading platform 8. This cassette loading platform 8 is configured so that it carries one or a plural number (two, in the case shown in the figure) of wafer cassettes 9 housing (approximately 25) semiconductor wafers 4. As indicated by the arrow in the figure, the wafer cassettes 9 are configured so that they can move up and down through being driven by a ball screw 12, and can move left and right via a sliding platform 8a driven by another screw 12a.

Figure 2:
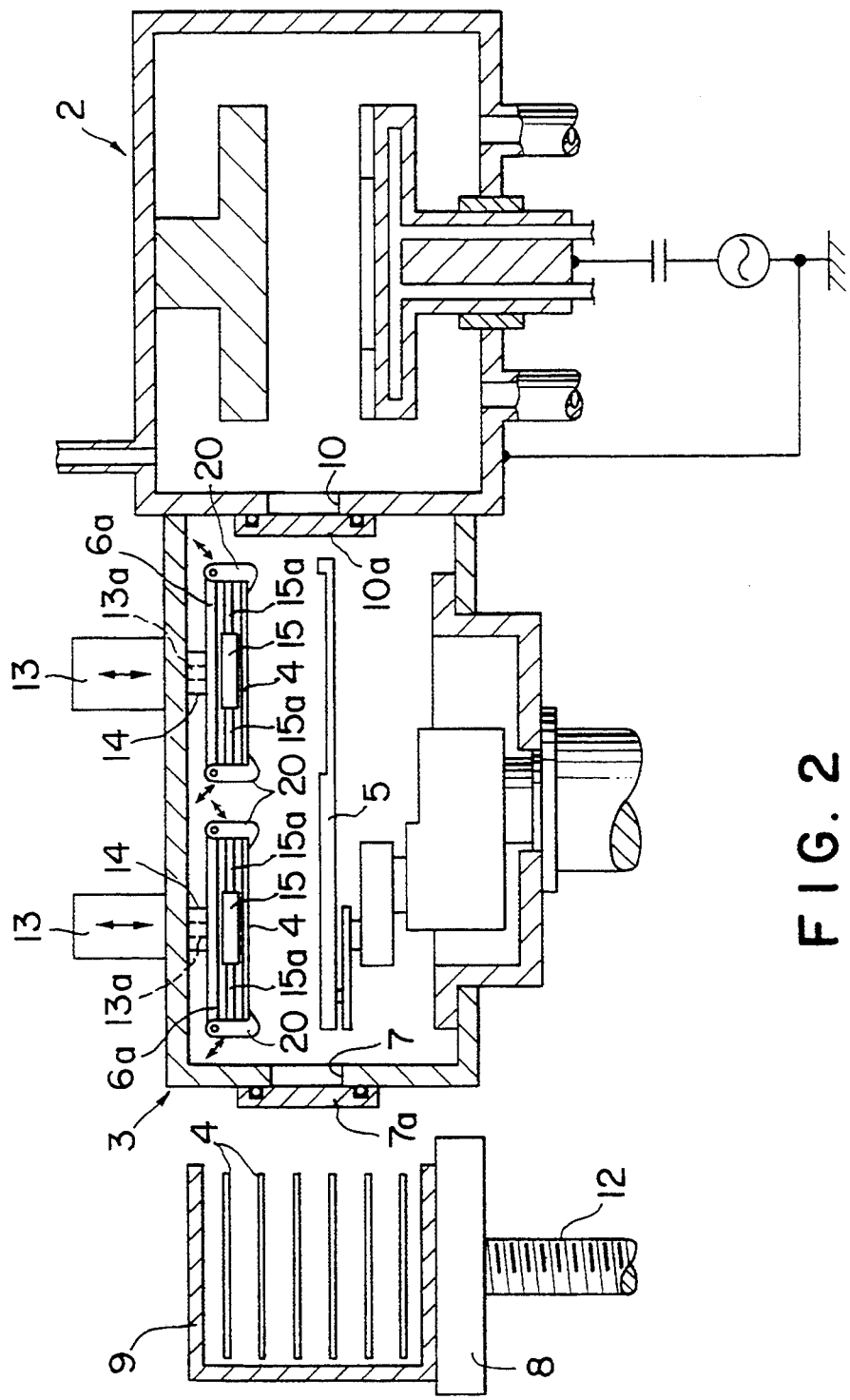
FIG. 2 is a longitudinal sectional view of a spare vacuum chamber of a semiconductor manufacturing apparatus according to a second embodiment of the present invention.

In addition, between the vacuum processing chamber 2 and the load lock chamber 3 is provided a spare vacuum chamber carrying-in and carrying-out opening 10 provided with a gate valve 10a (See FIG. 2). Moreover, a vacuum pump 35 is connected to the load lock chamber 3 via an exhaust tube 33 and a partition valve 33a, in a configuration so that the atmosphere internal to the load lock chamber 3 can be exhausted to a required degree of vacuum. In addition, an N₂ gas source which purges the load lock chamber 3 with N₂ gas and holds it in an oxygen-free status is connected to the load lock chamber 3 via the partition valve 32a and the supply tube 32. A vacuum source and an N₂ gas source are also connected in the same manner to the vacuum processing chamber 2.

The following is a description of the operation of the etching apparatus 1 according to a first embodiment of the present invention and having the configuration described above.

First, the cassette loading platform 8 is driven up and down and left and right and the this wafer cassette 9 is positioned at the carrying-in and carrying-out opening 7, and when the spare vacuum chamber carrying-in and carrying-out opening 10 is in the closed status, the carrying-in and carrying-out opening 7 is opened and the conveyor arm 5 swivels about its pivot and takes the semiconductor wafers 4 one at a time from the wafer cassette 9 which is loaded on the cassette loading platform 8, and conveys them into the load lock chamber 3. Then, the arm 50 of the conveyor arm 5 extends and positions either the upper or the lower semiconductor wafer 4 over the wafer support mechanism 6. Then when the wafer support mechanism 6 rises when there is this status, the semiconductor wafer 4 is passed to and received by the wafer support mechanism 6. When this occurs, the extension and contraction of the arm 50 takes about two or three seconds. In addition, when this occurs, dust may be generated when the semiconductor wafer 4 moves on the conveyor arm 5 and so such motion is extremely limited.

After this, the carrying-in and carrying-out opening 7 of the load lock chamber 3 is closed and the vacuum pump 35 exhausts the air (to create a vacuum) inside the load lock chamber 3, and when a required degree of vacuum has been attached inside the load lock chamber 3, N₂ gas is introduced and purging is performed, and the spare vacuum chamber carrying-in and carrying-out opening 10 is opened. When this is done, the creation of the vacuum normally takes about 30–40 seconds, and the purging by the N₂ gas usually takes about 30–40 seconds. Then, the conveyor arm 5 is used to take those semiconductor wafers 4 which have been processed, from the inside of the vacuum processing chamber 2 and to pass them to the top of the wafer support mechanism 6 which is empty inside the load lock chamber 3.

After this, the conveyor arm 5 conveys the unprocessed semiconductor wafer 4 which is supported on the wafer support mechanism 6, and places the unprocessed semiconductor wafer 4 on the processing portion inside the vacuum processing chamber 2.

After this, the spare vacuum chamber carrying-in and carrying-out opening 10 closes, the inside of the load lock chamber 3 is returned to normal pressure and the carrying-in and carrying-out opening 7 is opened. Then, the conveyor arm 5 carries the processed semiconductor wafer 4 supported on the wafer support mechanism 6 to outside of the load lock chamber 3 and returns the semiconductor wafer 4 inside the wafer cassette 9 loaded to the cassette loading platform 8. While this is being performed, etching processing of the semiconductor wafer 4 which has been carried in is performed.

Then, when there is an unprocessed semiconductor wafer 4 inside the this wafer cassette 9, the next semiconductor wafer 4 is loaded to the processing portion of the vacuum processing chamber 2 in the same manner as described above, and etching processing is performed.

In this manner, with the etching apparatus 1 according to a first embodiment of the present invention, there is only one load lock chamber 3 provided with respect to the vacuum processing chamber 2. Because of this, it is possible to greatly reduce the apparatus cost and to achieve a reduction in the installation space when compared to a conventional etching apparatus which is provided with the two spare vacuum chambers of a carrying in spare vacuum chamber and a carrying out spare vacuum chamber.

In addition, by the temporary placement of the semiconductor wafer 4 on the wafer support mechanism 6 provided inside the load lock chamber 3, it is possible to efficiently implement the carrying-in and the carrying-out of other semiconductor wafers 4. Because of this, according to this embodiment, it is possible to use the one spare vacuum chamber to ensure substantially the same throughput as a conventional semiconductor manufacturing apparatus provided with the two spare vacuum chambers of a spare vacuum chamber for carrying in and a spare vacuum chamber for carrying out.

Moreover, when as in the case of a conventional apparatus, there is no wafer support mechanism 6 inside the load lock chamber 3, it is not possible to temporarily place the semiconductor wafer 4 and so it is not possible to implement the operation for carrying in the next semiconductor wafer 4 until the processed semiconductor wafer 4 has been carried out, and therefore this causes the throughput to drop.

Accordingly, according to a first embodiment of the present invention, when compared to a conventional apparatus, it is possible to reduce the apparatus cost, to reduce the installation space, and to therefore reduce the manufacturing cost due to the reduction in the installation cost.

Figure 3:
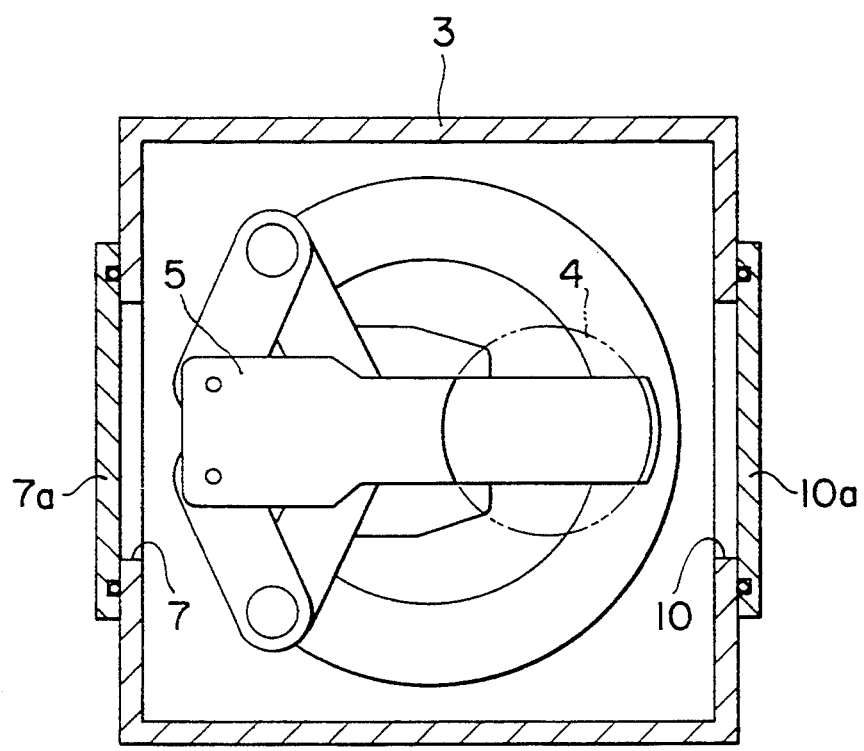
FIG. 3 is a lateral sectional view of the spare vacuum chamber shown in FIG. 2.
Figure 6:
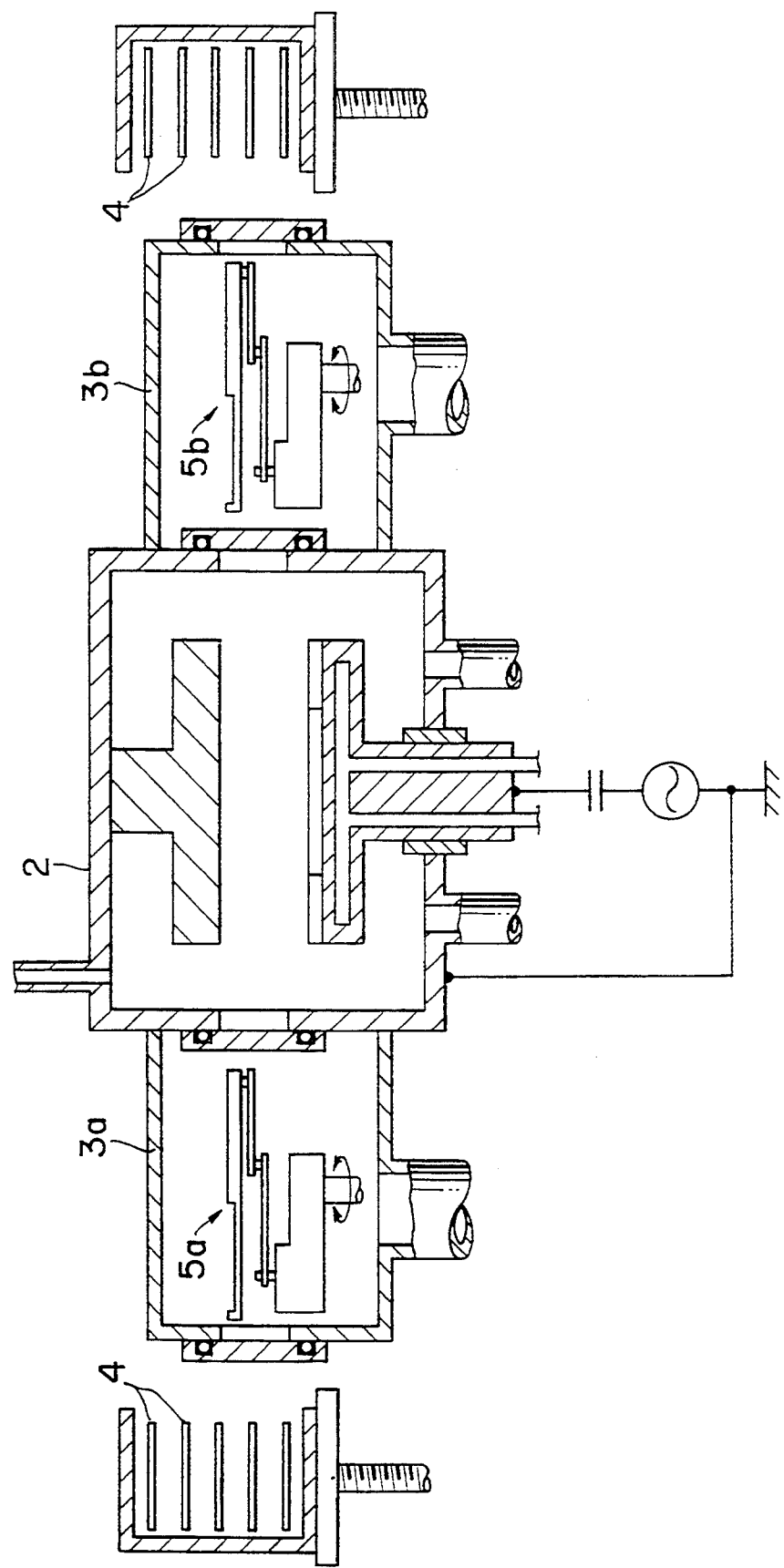
FIG. 6 is a longitudinal sectional view of a conventional semiconductor manufacturing apparatus.

The following is a description of a second embodiment of the semiconductor manufacturing apparatus according to the present invention, and with reference to FIG. 2 and FIG. 3. In this second embodiment, two wafer support mechanisms 6a are provided suspended from the ceiling portion 3a of the load lock chamber 3. These wafer support mechanisms 6a are configured so as to be movable up and down by a reciprocating motion mechanism such as a hydraulic cylinder or the like provided to the ceiling 3a, and rods 13 of these cylinders are protected by a bellows 14. As shown by the arrow in the figure, the configuration is such that an edge portion of the semiconductor wafer 4 is held by a plural number of fingers 20 which are configured so as to be rotatable by a rod 15a of a hydraulic cylinder 15. Then, when the semiconductor wafer 4 is conveyed and positioned on the lower wafer support mechanism 6a by the conveyor arm 5, the wafer support mechanism 6a receives the conveyor arm 5 from the semiconductor wafer 4 by the fingers 20 rotating to hold the edge portion of the semiconductor wafer 4 and then rising slightly. On the other hand, the configuration is such that the reverse rotation of the fingers 20 cancels this hold and passes the semiconductor wafer 4 to the conveyor arm 5.

If a load lock chamber 3 configured in this manner is used, then it is possible to obtain the same effect as obtained by the first embodiment described above, for the load lock chamber 3 to be formed more compactly, and for the time required to exhaust (and create a vacuum inside) the inside of the load lock chamber 3 to be reduced.

In addition, with the first embodiment described above, the description was given for the case when the wafer support mechanisms 6, 6a were provided inside the load lock chamber 3. However, as shown in FIG. 4 and FIG. 5, it is possible to use a conveyor arm 5a configured so as to support two semiconductor wafers 4.

More specifically, in this third embodiment, the conveyor arm 5a is configured so as to be rotatable about the center of a shaft 30, and is provided with wafer support portions 31 at each of its ends and which are configured so that it is possible to support two semiconductor wafers 4. The configuration is such that the rotation of the wafer support portion 31 about the center of the shaft 30 enables the loading operation for the unprocessed semiconductor wafer 4 to be performed after the unloading operation of the processed semiconductor wafer 4 for example. If such a conveyor arm 5a is used, then it is possible to prevent the throughput from being lowered and without the use of the wafer support mechanism 6, 6a as in the case of the embodiments described above. In addition, if the conveyor arms 5 and the like described above are provided in a pair inside the spare vacuum chamber so that they overlap top and bottom, then it is possible to simultaneously support two semiconductor wafers 4.

Moreover, the present invention is not limited in its application to etching apparatus, but can be applied to all types of semiconductor manufacturing apparatus of the leaf type and which perform processing under conditions of reduced atmospheric pressure.

As has been described above, according to the semiconductor manufacturing apparatus of the present invention, when compared to a conventional apparatus, it is possible to reduce the apparatus cost, to reduce the installation space, and to therefore reduce the manufacturing cost due to the reduction in the installation cost.

What is claimed is:

1. A semiconductor manufacturing apparatus comprising:
   a vacuum processing chamber for implementing a processing to an object of processing under an atmosphere of reduced pressure; and
   a single spare vacuum chamber which is provided adjacent said vacuum processing chamber, said single spare vacuum chamber being provided therein with a conveyor arm to convey an object of processing,
   said conveyor arm having support portions for supporting at least two objects of processing, said conveyor arm being configured so that at least one object to be processed and one object that has been processed can be simultaneously conveyed by said conveyor arm, whereby an object of processing is conveyed to said vacuum processing chamber through said single spare vacuum chamber, and an object of processing is conveyed from said vacuum processing chamber through said single spare vacuum chamber.

2. A semiconductor manufacturing apparatus comprising:
   a vacuum processing chamber for implementing a processing to an object of processing under an atmosphere of reduced pressure; and
   a single spare vacuum chamber which is provided adjacent said vacuum processing chamber, said single spare vacuum chamber being provided therein with a support mechanism to support an object of processing and a conveyor arm to convey an object of processing,
   said support mechanism including two shelves which can move up and down and which can each support an object of processing.

3. A semiconductor manufacturing apparatus comprising:
   a vacuum processing chamber for implementing a processing to an object of processing under an atmosphere of reduced pressure; and
   a single spare vacuum chamber which is provided adjacent said vacuum processing chamber, said single spare vacuum chamber being provided therein with a support mechanism to support an object of processing and a conveyor arm to convey an object of processing, said support mechanism being suspended from a ceiling portion of said spare vacuum chamber and being configured so that a pair of rotatable fingers thereof hold an edge portion of an object for processing.

4. The semiconductor manufacturing apparatus of claim 1, wherein at least one of said support portions rotates about a shaft.

5. The semiconductor manufacturing apparatus of claim 1, wherein said object of processing is a semiconductor wafer.

6. The semiconductor manufacturing apparatus of claim 1, wherein said processing is etching processing.

7. The semiconductor manufacturing apparatus of claim 3, wherein said support mechanism is provided with either heating means or cooling means therein.

8. The semiconductor manufacturing apparatus of claim 3, wherein said object of processing is a semiconductor wafer.

9. The semiconductor manufacturing apparatus of claim 3, wherein said support mechanism is configured so that at least one object to be processed and at least one object that has been processed can be simultaneously supported.

10. The semiconductor manufacturing apparatus of claim 1, further including a support mechanism which includes two shelves which can each support an object of processing.

11. The semiconductor device manufacturing apparatus of claim 1, wherein said support portions are configured
to be symmetrical about a shaft, to support an object to be processed thereon, and to rotate about said shaft.

* * * * *